(12) United States Patent
Su

(10) Patent No.: US 7,082,666 B2
(45) Date of Patent: Aug. 1, 2006

(54) METHOD FOR TESTING PRINT CIRCUIT BOARDS

(76) Inventor: Sung-Ling Su, No. 65, Alley 2, Lane 329, Fu-Lin Road, Shih-Lin District, Taipei (TW)

( * ) Notice: Subject to any disclaimer, the term of this patent is extended or adjusted under 35 U.S.C. 154(b) by 383 days.

(21) Appl. No.: 10/627,837

(22) Filed: Jul. 25, 2003

(65) Prior Publication Data

US 2005/0015967 A1 Jan. 27, 2005

(51) Int. Cl.
*G01R 31/28* (2006.01)
(52) U.S. Cl. .................... 29/593; 29/592.1; 29/832; 29/854; 73/865.4
(58) Field of Classification Search ............. 29/593, 29/832, 854, 592.1; 73/865.4
See application file for complete search history.

(56) References Cited

U.S. PATENT DOCUMENTS 5,633,471 A * 5/1997 Fukushima ............... 73/865.4
5,698,990 A * 12/1997 Aussant et al. ............ 324/761
6,255,834 B1 * 7/2001 Smith ...................... 324/755

OTHER PUBLICATIONS

"A multilayer board-type magnetic field probe with high spatial resolution and RF current estimation method for ICs"; Masuda, N.; Tamaki, N.; Wabuka, H.; Watanabe, T.; Ishizaka, K.; International Symposium on May 17-21, 1999; p. 801.*

* cited by examiner

*Primary Examiner*—Paul D. Kim

(57) ABSTRACT

A method for testing a printed circuit board includes manufacturing a dedicated testing board having protrusive metal points corresponding to the points to be tested on the printed circuit board. A pressure sensitive conductive rubber layer is inserted between the protrusive metal points and the test points. The method connects the protrusive metal points with the points to be tested on the printed circuit board by using the pressure from the press and the flexibility of the conductive rubber. The testing board having protrusive metal points is connected to the dedicated tester through flat cables so that each protrusive metal point is connected to a test node in the tester.

7 Claims, 3 Drawing Sheets

METHOD FOR TESTING PRINT CIRCUIT BOARDS

FIELD OF THE INVENTION

The present invention relates to the field of printed circuit boards, and more particular, to a method for testing printed circuit boards by using conductive rubber.

BACKGROUND OF THE INVENTION

The conventional devices for testing open/short of printed circuit boards generally include flying probe tester, universal tester and dedicated tester.

The flying probe tester is commonly used for testing small quantities of printed circuit boards, while the remaining testers are used for large quantities. The universal tester is expensive itself but it uses a test fixture that is less expensive. On the contrary, the dedicated tester is cheap but requires a test fixture that is expensive.

The dedicated testing chooses points to be tested according to circuit layout of a tested printed circuit board and chooses proper spring probes according to the size of the points to be tested and the distance between adjacent points to be tested. Two principles are employed in choosing the spring probes: (1) whether or not, the spring probes include features suitable to test the points; (2) after the receptacles of the probes inserted in the fixing board of test fixture, no short circuit happened. The diameters of receptacles for the spring probes are within the range between 0.45 m/m to 1.65 m/m.

The process for making the conventional dedicated testing is to choose proper points to be tested and the diameters of the probes, drilling holes in the fixing board with proper diameters according to the diameters of the receptacles. The coordinates of holes and points to be tested are the same. Each hole is inserted with a receptacle. The holes for connectors are defined at a side of the fixing board and connectors are inserted in the holes. The number of the pins of the connectors has to be larger than or equal to the number of the probes. Conductive wires are wound between the pins and the receptacles pair by pair, and each receptacle is inserted with a probe.

When using the dedicated tester, the test fixture has to be fixed to the press of the tester and the connectors on the test fixture are connected to the tester with flat cables so that each probe is connected to a test node in the tester. When the press is lowered, the spring in the probe is applied by a force so that the plunger of the probe and the point to be tested on the printed circuit board are electrically connected so that the points to be tested on the printed circuit board become conductive with the test node in the tester because of close contact. This can be used to test the open/short of each trace of the layout.

The spring probe is a contact tool with a complicated structure including a receptacle, a barrel, a plunger and a spring between plunger and barrel. It is difficult to make a small size spring probe, which is expensive and has a short service life. The conventional receptacle can only be made to 0.4 m/m so that it is not suitable to test a printed circuit board with a gap less than 0.4 m/m between two points.

SUMMARY OF THE INVENTION

The present invention relates to a method for testing a printed circuit board and the method is carried out by using an innovative dedicated test fixture, which employs conductive rubber and a dedicated printed circuit board. The test fixture can be easily manufactured and is less expensive. The innovative method of the present invention allows for easy test of sophisticated printed circuit boards with small pads arranged in for example 0.1 millimeter width and 0.15 millimeter gap.

The present invention uses software to choose all the points to be tested on the printed circuit board and makes a testing board having many protrusive points. The test board with protrusive points has holes for the connectors in one side. The number of the holes for the connectors is larger than or equal to the sum of the protrusive metal points. The coordinates of the protrusive metal points on the testing board and points to be tested on printed circuit board are the same. The size of each protrusive point is defined according to size of points to be tested on the printed circuit board.

The protrusive metal points are connected to the holes for the connectors on a side of testing board by way of layouts. The testing board having protrusive metal points is connected to the dedicated tester through flat cables so that the protrusive metal points are connected to the test nodes in the tester.

Tip of each protrusive metal point is coated with flexible conductive rubber by using liquid conductive rubber or electrically Z-axis conductive adhesive film. By using the pressure from the press of the tester, the points to be tested in a printed circuit board are connected to the conductive rubber on the tip of the protrusive metal points so that each trace of the layout can be tested.

The present invention will become more obvious from the following description when taken in connection with the accompanying drawings, which show, for purposes of illustration only, a preferred embodiment in accordance with the present invention.

DETAILED DESCRIPTION OF THE PREFERRED EMBODIMENT

The present invention relates to a method for testing printed circuit boards. The method is carried out by using a dedicated test fixture that is made of conductive rubber and a dedicated printed circuit board.

Figure 1:
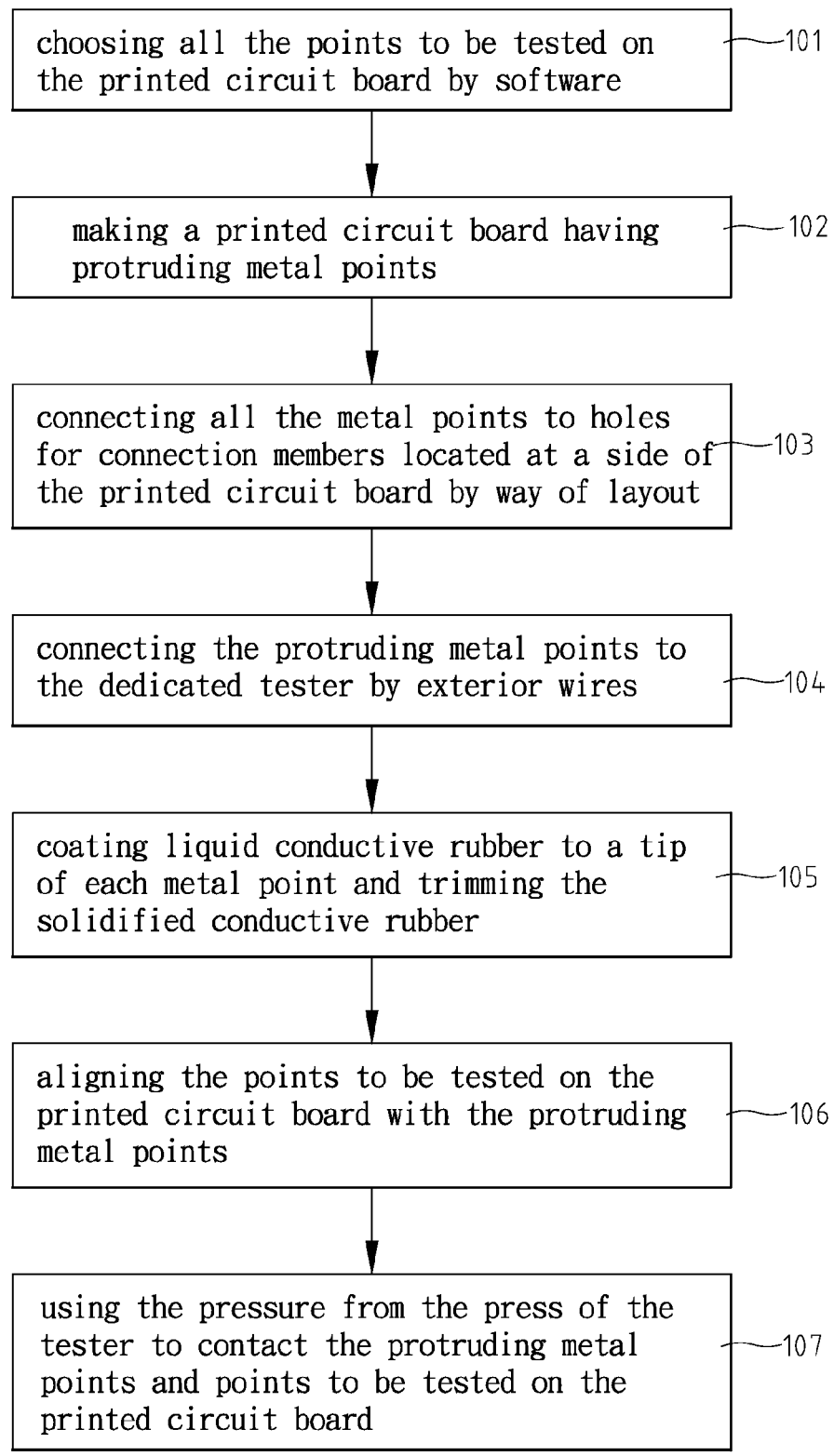
FIG. 1 is a flow chart of a first embodiment of the present invention.

Referring to FIG. 1, step 101 first uses software to choose points to be tested on the printed circuit board. Step 102 then uses all information about the points to be tested and manufactures a testing board having protrusive metal points. The coordinates of the protrusive metal points on the testing board and the points to be tested on the printed circuit board are the same. There are holes for connectors defined in a side of the testing board of fixture for inserting the connectors to the testing board of fixture.

Step 103 connects all the protrusive metal points to the holes in a side on the testing board having protrusive metal points by layouts. Step 104 proceeds and the testing board having protrusive metal points is connected to the dedicated tester through flat cables so that each protrusive metal point is connected to a test node in the tester.

In step 105 the liquid conductive rubber is coated to the tip of each protrusive metal point. After the liquid conductive rubber is solidified, a knife is used to trim them to make all the conductive rubbers flush with each other. Step 106 aligns the points to be tested on the printed circuit board with the protrusive metal points on the testing board. Then step 107 proceeds to connect the protrusive metal points with the points to be tested on the printed circuit board by using the pressure from the press and the flexibility of the conductive rubber.

Because the conductive rubber is flexible, it compensates for the differences of height between the points to be tested on the printed circuit board and allows the testing board having protrusive metal points to contact the points to be tested on the printed circuit board in good condition. The result for testing open/short of each trace of layout on the printed circuit board is excellent. If the protrusive metal points are higher than the connection circuits on the testing board, the contact between the protrusive metal points and the points to be tested on the printed circuit board will be much better.

Figure 2:
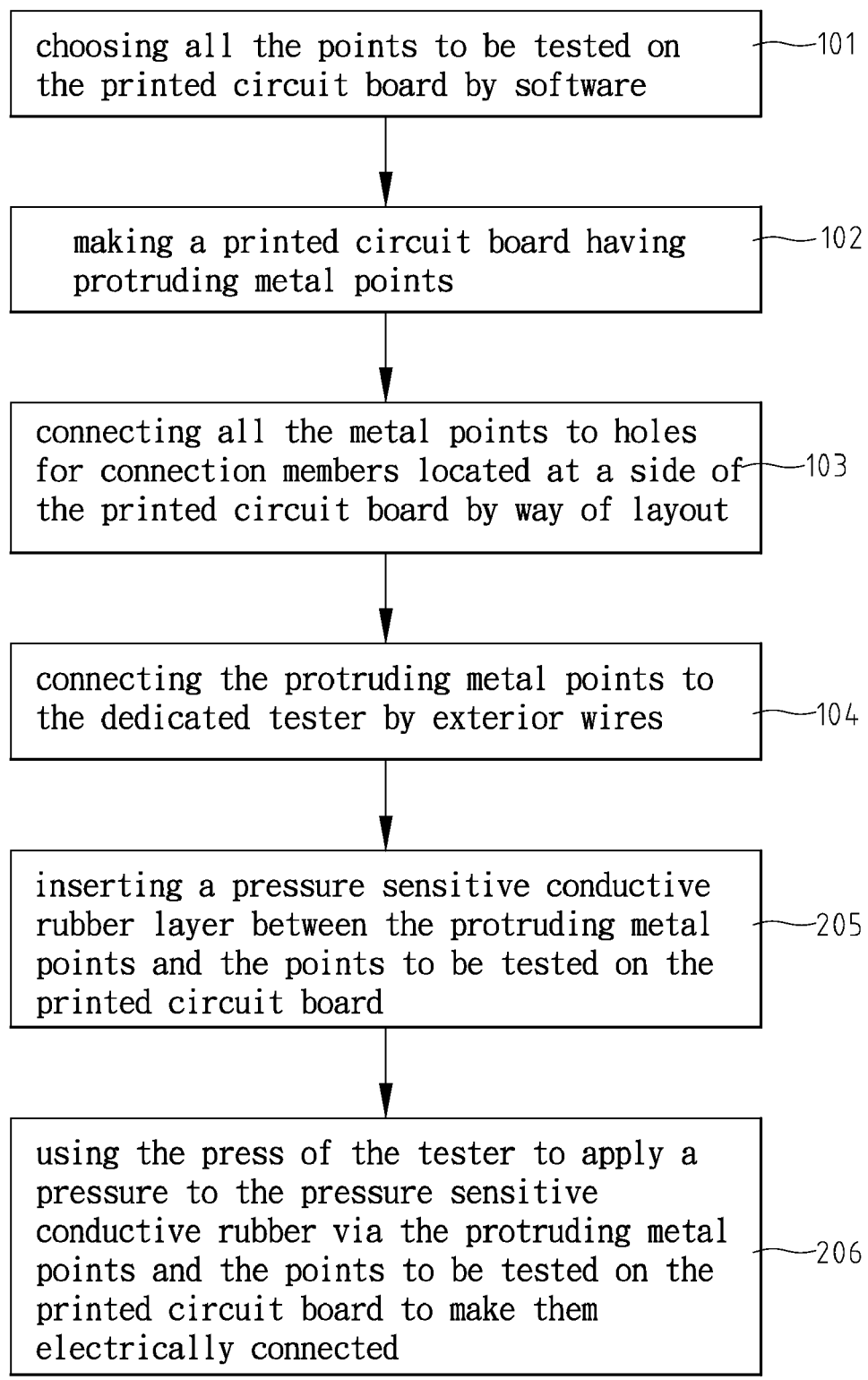
FIG. 2 is a flow chart of a second embodiment of the present invention.

FIG. 2 is a flow chart of a second embodiment of the present invention. In FIG. 2, step 101 first uses software to choose points to be tested on the printed circuit board. Step 102 then uses all information about the points to be tested and manufactures a testing board having protrusive metal points. The coordinates of the protrusive metal points on testing board and the points to be tested on the printed circuit board are the same. The protrusive metal points are higher than the rest of the layout. There are holes for connectors defined in a side of the testing board for inserting the connectors to the testing board.

Step 103 connects all the protruding metal points to the holes in a side of the testing board having protrusive metal points by layouts. Step 104 proceeds and the testing board having protrusive metal points is connected to the dedicated tester through flat cables so that each protrusive metal point is connected to a test node in the tester. The protrusive metal points are higher than the rest of the layout.

Then step 205 proceeds to insert a pressure sensitive conductive rubber layer between the testing board having protrusive metal points and the printed circuit board to be tested. Step 206 proceeds and the press of the tester applies a pressure to the protrusive metal points and the points to be tested on the printed circuit board so that the pressure sensitive conductive rubber senses the pressure layer, which electrically connects the protrusive metal points and the points on the printed circuit board. The open/short of each trace on the printed circuit board can be tested.

Figure 3:
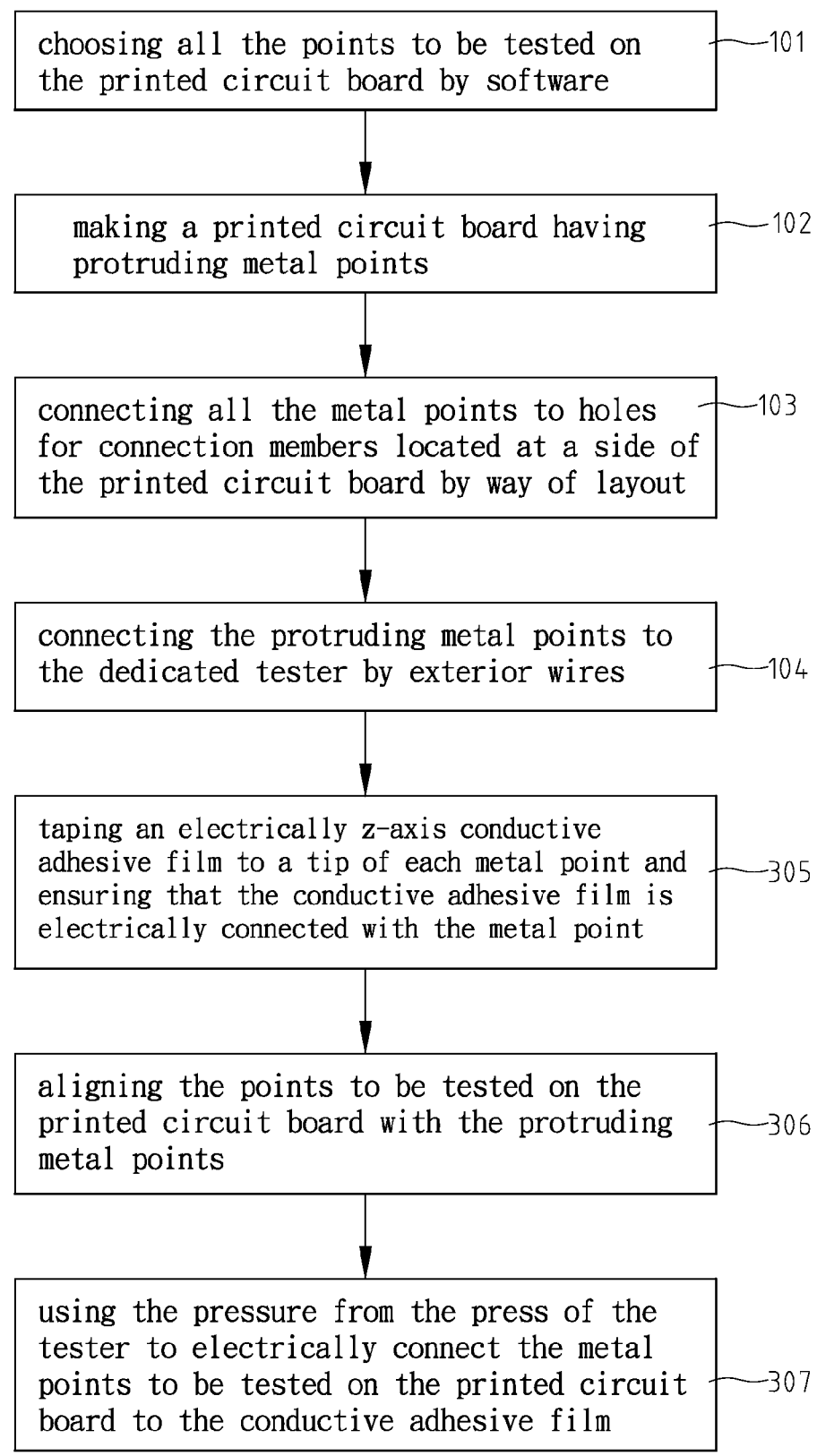
FIG. 3 is a flow chart of a third embodiment of the present invention.

FIG. 3 is a flow chart of a third embodiment of the present invention. In FIG. 3, step 101 first uses software to choose points to be tested on the printed circuit board. Step 102 then uses all information about the points to be tested and manufactures a testing board having protrusive metal points. The coordinates of the metal points and the points to be tested on the printed circuit board are the same. There are holes for connectors defined in a side of the testing board for inserting the connectors to the testing board. The number of the holes has to be larger than or equal to the sum of the protrusive metal points.

Step 103 connects all the protrusive metal points to the holes in a side of the testing board having protrusive metal points by layouts. Step 104 proceeds and the testing board having protrusive metal points is connected to the dedicated tester through flat cables so that each protrusive metal point is connected to a test node in the tester. The protrusive metal points are higher than the rest of the layout.

Finally, step 305 proceeds, and each protrusive metal point is taped with an electrically z-axis conductive adhesive film which is conductive in vertical direction. Step 306 then proceeds to align all the points to be tested on the printed circuit board and the protrusive metal points on the testing board. Step 307 employs the pressure of the press of the tester and the flexibility of the conductive adhesive film to electrically contact the protruding metal points and the points to be tested on the printed circuit board.

While we have shown and described the embodiments in accordance with the present invention, it should be clear to those skilled in the art that further embodiments may be made without departing from the scope of the present invention.

What is claimed is:

1. A method for testing printed circuit boards comprising the steps of:
    (a) determining all points to be tested on a printed circuit board;
    (b) manufacturing a testing board having protrusive metal points corresponding to the points to be tested on the circuit board and at least one set of connector holes for connectors;
    (c) connecting the protrusive metal points to the connector holes on the testing board;
    (d) inserting connectors in the connector holes and connecting each connector to a test node in a tester;
    (e) inserting at least one pressure sensitive conductive rubber layer between the testing board and the printed circuit board to be tested; and
    (f) testing the points to be tested on the printed circuit board by pressuring the pressure sensitive conductive layer using a press of the tester to electrically connect the protrusive metal points and the points to be tested.

2. The method as claimed in claim 1, wherein in step (a) software is used to determine all points on the printed circuit board to be tested.

3. The method as claimed in claim 1, wherein the connector holes in step (b) are located at a side of the testing board.

4. The method as claimed in claim 1, wherein coordinates of the protrusive metal points in step (b) are the same as those of the points to be tested on the printed circuit board.

5. The method as claimed in claim 1, wherein connecting the protrusive metal points to the connector holes on the testing board in step (c) is made by way of layout.

6. The method as claimed in claim 1, wherein connecting each connector to a test node in step (d) is made by flat cables.

7. The method as claimed in claim 1, wherein the tester in step (d) is a dedicated tester.

* * * * *